United States Patent
Burinskiy et al.

(10) Patent No.: US 7,030,678 B1
(45) Date of Patent: Apr. 18, 2006

(54) LEVEL SHIFTER THAT PROVIDES HIGH-SPEED OPERATION BETWEEN POWER DOMAINS THAT HAVE A LARGE VOLTAGE DIFFERENCE

(75) Inventors: Alexander Burinskiy, San Jose, CA (US); Vladislav Potanin, San Jose, CA (US); Elena Potanina, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/776,834

(22) Filed: Feb. 11, 2004

(51) Int. Cl.
*H03L 5/00* (2006.01)
(52) U.S. Cl. .................................................... 327/333
(58) Field of Classification Search ........ 327/309–310, 327/317–319, 321–322, 327–328, 333; 326/62–63, 326/68, 75, 80–81
See application file for complete search history.

(56) References Cited

U.S. PATENT DOCUMENTS

| | | | |
|---|---|---|---|
| 6,369,632 B1 * | 4/2002 | Barnes | 327/211 |
| 6,385,099 B1 * | 5/2002 | Taub | 365/189.11 |
| 6,414,534 B1 * | 7/2002 | Wang et al. | 327/333 |
| 6,590,420 B1 | 7/2003 | Mnich et al. | 326/68 |
| 6,717,453 B1 * | 4/2004 | Aoki | 327/333 |
| 6,750,696 B1 * | 6/2004 | Shimada et al. | 327/333 |
| 6,774,695 B1 * | 8/2004 | Hayashi et al. | 327/333 |
| 6,777,992 B1 * | 8/2004 | Ziesler et al. | 327/208 |

* cited by examiner

*Primary Examiner*—My-Trang Nu Ton
(74) *Attorney, Agent, or Firm*—Mark C. Pickering

(57) ABSTRACT

The speed of a level shifter, which translates a first voltage in a first power domain to a second voltage in a second power domain, is increased by utilizing a first bipolar transistor to assist a first MOS transistor in pulling down the voltage on a first output node, and a second bipolar transistor to assist a second MOS transistor in pulling down the voltage on a second output node.

19 Claims, 1 Drawing Sheet

LEVEL SHIFTER THAT PROVIDES HIGH-SPEED OPERATION BETWEEN POWER DOMAINS THAT HAVE A LARGE VOLTAGE DIFFERENCE

BACKGROUND OF THE INVENTION

1. Field of the Invention

The present invention relates to level shifters and, more particularly, to a level shifter that provides high-speed operation between power domains that have a large voltage difference.

2. Description of the Related Art

A level shifter is a common circuit device that is used to translate a logic signal from a first power domain to a second power domain. A deep sub-micron digital circuit can represent a logic low with ground and a logic high with a voltage of, for example, 1.2 volts. When this circuit communicates with another circuit that represents a logic low with ground and a logic high with a voltage of, for example, 3.6 volts, a level shifter is used to shift the 1.2V logic high to a 3.6V logic high.

FIG. 1 shows a circuit diagram that illustrates a prior art level shifter 100. As shown in FIG. 1, level shifter 100 includes an inverter that has a PMOS transistor M1 and an NMOS transistor M2. PMOS transistor M1 has a source connected to a first voltage source VDD1, such as 1.2V, a gate connected to an input node IN, and a drain. NMOS transistor M2 has a drain connected to the drain of PMOS transistor M1, a source connected to ground, and a gate connected to the input node IN.

As further shown in FIG. 1, level shifter 100 also has an NMOS transistor M3 and an NMOS transistor M4. NMOS transistor M3 has a source connected to ground VSS, a drain connected to an inverted output node OUTbar, and a gate connected to the gates of transistors M1 and M2. NMOS transistor M4, which is substantially the same size as NMOS transistor M3, has a source connected to ground VSS, a drain connected to an output node OUT, and a gate connected to the drains of transistors M1 and M2.

Level shifter 100 further has a PMOS transistor M5 and a PMOS transistor M6. PMOS transistor M5 has a source connected to a second voltage source VDD2, such as 3.6V, a drain connected to the inverted output node OUTbar, and a gate connected to the output node OUT. PMOS transistor M6, which is substantially the same size as transistor M5, has a source connected to the second voltage source VDD2, a drain connected to the output node OUT, and a gate connected to the inverted output node OUTbar.

In operation, when a logic low, represented by ground, is present on the input node IN, PMOS transistor M1 is turned on and NMOS transistors M2 and M3 are turned off. When PMOS transistor M1 is turned on, the first supply voltage VDD1 is placed on the gate of NMOS transistor M4 which, in turn, turns on NMOS transistor M4. When NMOS transistor M4 is turned on, the voltage on the output node OUT is pulled down to ground. Thus, the logic state on the output node OUT of level shifter 100 matches the logic state on the input node IN.

When the voltage on the output node OUT is pulled down to ground by NMOS transistor M4, PMOS transistor M5 is turned on. When PMOS transistor M5 is turned on, the second supply voltage VDD2 is placed on the gate of PMOS transistor M6 which, in turn, turns off PMOS transistor M6.

In addition, the second supply voltage VDD2 is also placed on the inverted output node OUTbar. Thus, the logic state on the inverted output node OUTbar of level shifter 100 is the inverse of the logic state on the input node IN. Further, the voltage level of the logic high state has been level shifted up from 1.2V to 3.6V.

When the logic state on the input node IN transitions from a logic low to a logic high, PMOS transistor M1 turns off and NMOS transistors M2 and M3 turn on. When NMOS transistor M2 turns on, NMOS transistor M2 pulls down the voltage on the gate of NMOS transistor M4, thereby turning off transistor M4.

When NMOS transistor M3 turns on, NMOS transistor M3 immediately saturates, sinking a peak current given by Equation 1:

$$IDS3 = \min\,[(KW_3/L_3)(V_{DD1}-V_{TH})^2;\ (KW_5/L_5)(V_{DD2}-V_{TH})^2 + I_{EQ}],\qquad \text{EQ.1}$$

where $K=\mu C/2D$, $W_3$ is the width of transistor M3, $L_3$ is the length of transistor M3, $W_5$ is the width of transistor M5, $L_5$ is the length of transistor M5, $I_{EQ}$ is the equivalent current of recharging all the parasitic capacitance associated with node OUTbar, and $V_{TH}$ is the threshold voltage. (IDS3=min [I3; I5] means the minimum of I3 and I5.)

At this point, NMOS transistor M3 sinks all of the current sourced by PMOS transistor M5 and a current from the inverted output node OUTbar, thereby pulling down the voltage on the inverted output node OUTbar. As the voltage on the inverted output node OUTbar falls, PMOS transistor M6 turns on when the gate-to-source voltage of transistor M6 falls below the threshold voltage of transistor M6.

Ideally, NMOS transistor M2 pulls down the voltage on the gate of NMOS transistor M4 and turns off transistor M4 before NMOS transistor M3 can pull down the voltage on the inverted output node OUTbar to turn on PMOS transistor M6. This minimizes the amount of shoot-through current (the current sourced by PMOS transistor M6 that is sunk by NMOS transistor M4).

When NMOS transistor M4 is turned off and PMOS transistor M6 is turned on, PMOS transistor M6 begins charging up the voltage on the output node OUT. Thus, at this point, NMOS transistor M3 is pulling down the voltage on the inverted output node OUTbar while PMOS transistor M6 is pulling up the voltage on the output node OUT.

Under normal operating conditions, as the voltage on the output node OUT continues to rise, PMOS transistor M5 turns off when the gate-to-source voltage of PMOS transistor M5 reaches the threshold voltage of PMOS transistor M5. When PMOS transistor M5 turns off, NMOS transistor M3 pulls the remaining voltage on the inverted output node OUTbar down to ground as PMOS transistor M6 charges the voltage on the output node OUT up to the second supply voltage VDD2.

Thus, the logic state on the output node OUT of level shifter 100 is the same as the logic state on the input node IN. Further, the voltage level of the logic high state has been level shifted up from 1.2V to 3.6V. In addition, the logic low state is present on the inverse output node OUTbar.

The sizes of transistors M3 and M5 are defined to guarantee that NMOS transistor M3 sinks all of the current sourced by PMOS transistor M5 after PMOS transistor M5 saturates. When the $KW_5/L_5$ of PMOS transistor M5 is not small enough in comparison with the $KW_3/L_3$ of NMOS transistor M3, and the second supply voltage VDD2 is large enough in comparison with the first supply voltage VDD1, then NMOS transistor M3 can not overdrive the current of PMOS transistor M5 and the circuit will never flip the states of nodes OUTbar and OUT.

Thus, a limitation on $KW_5/L_5$ has to be applied from the upper side for a given VDD1/VDD2 range and $KW_3/L_3$, causing the $gm_5$ of PMOS transistor M5 to be substantially lower than the $gm_3$ of NMOS transistor M3 if the circuit is designed to be working at a second supply voltage VDD2 that is larger than the first supply voltage VDD1 condition.

To insure that this condition is met, the saturation current IDS3 can be set to be equal to the saturation current ISD5 at the minimum possible value of the first supply voltage VDD1 and the maximum possible value of the second supply voltage VDD2. In addition, to insure against a worst case condition, the gate voltage of PMOS transistor M5 can be assumed to be zero volts. As a result, ISD5=$(KW_5/L_5)$ $(VDD2-V_{TH})^2$.

Setting the saturation current IDS3 to be equal to the saturation current ISD5 provides:

$$(KW_3/L_3)(VDD1-V_{TH})^2=(KW_5/L_5)(VDD2-V_{TH})^2.$$

Rearranging provides:

$$W_3L_5/L_3W_5=(VDD2-V_{TH})^2/(VDD1-V_{TH})^2.$$

Thus, by utilizing the above ratios, NMOS transistor M3 is guaranteed to sink all of the current sourced by PMOS transistor M5 after transistor M5 saturates. In addition, since NMOS transistors M3 and M4 are substantially the same size, and since PMOS transistors M5 and M6 are substantially the same size, the same ratios used for transistors M3 and M5 are also used for transistors M4 and M6.

One of the problems of level shifter 100 is that when level shifter 100 is used with a first supply voltage VDD1 that is smaller than the second supply voltage VDD2, the W5/L5 of PMOS transistor M5 has to be enough smaller than the W3/L3 of NMOS transistor M3 to reduce the gm5 of PMOS transistor M5.

This can be done by increasing the length L5 of PMOS transistor M5. However, as the channel length L5 increases, the speed of operation decreases. As a result, there is a need for a level shifter that provides high-speed operation between power domains that have a large voltage difference.

DETAILED DESCRIPTION OF THE INVENTION

Figure 1:
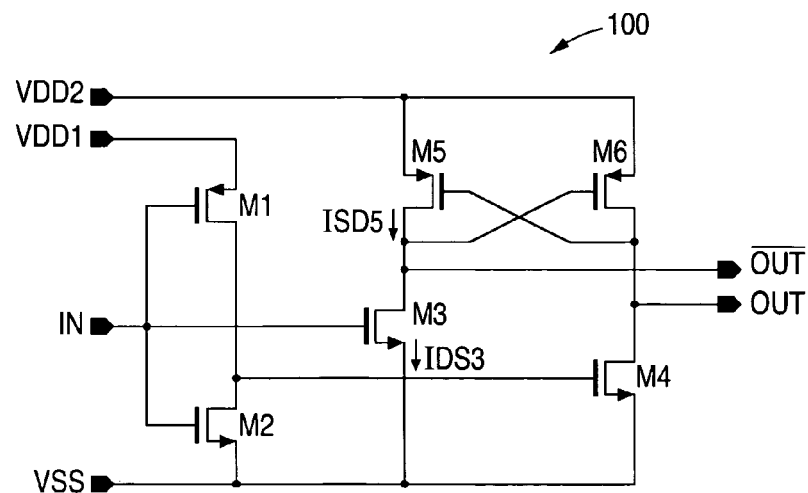
FIG. 1 is a circuit diagram illustrating a prior art level shifter 100.
Figure 2:
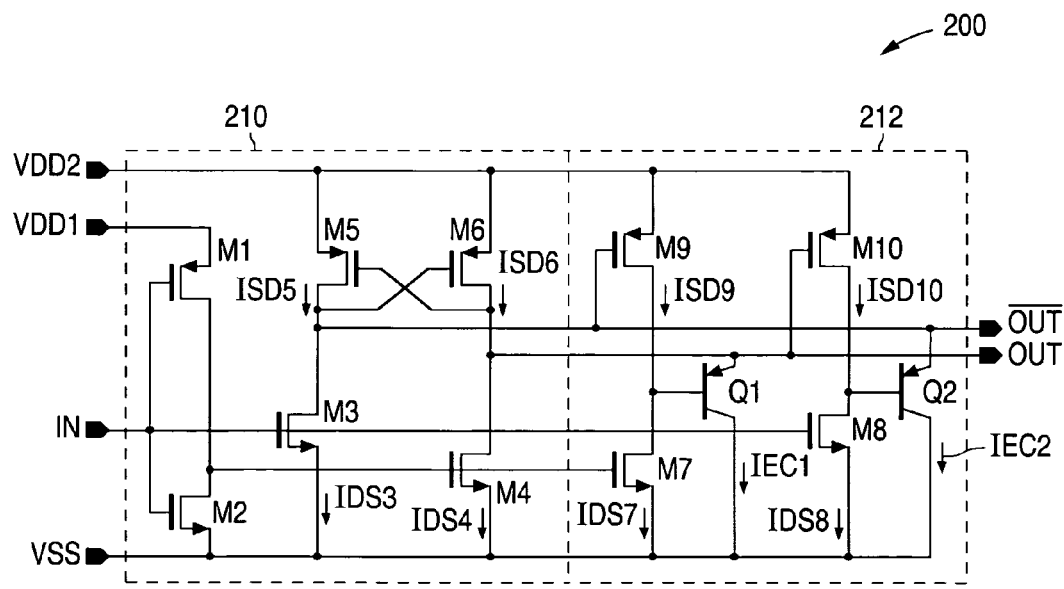
FIG. 2 is a circuit diagram illustrating an example of a level shifter 200 in accordance with the present invention.

FIG. 2 shows a circuit diagram that illustrates an example of a level shifter 200 in accordance with the present invention. As shown in FIG. 2, level shifter 200 includes an input stage 210 and an output stage 212. Input stage 210 is similar to level shifter 100 and, as a result, utilizes the same reference numerals to designate the elements that are common to both level shifters. As described in greater detail below, PMOS transistors M5 and M6 of level shifter 200 can be formed to source more current than PMOS transistors M5 and M6 of level shifter 100.

As further shown in FIG. 2, output stage 212 includes an NMOS transistor M7 and an NMOS transistor M8. NMOS transistor M7 has a source connected to ground VSS, a drain, and a gate connected to the gate of NMOS transistors M4. NMOS transistor M8, which is substantially the same size as NMOS transistor M7, has a source connected to ground VSS, a drain, and a gate connected to the gate of transistor M3.

Output stage 212 further has a PMOS transistor M9 and a PMOS transistor M10. PMOS transistor M9 has a source connected to the second voltage source VDD2, a drain connected to the drain of NMOS transistor M7, and a gate connected to the inverted output node OUTbar. PMOS transistor M10, which is substantially the same size as transistor M9, has a source connected to the second voltage source VDD2, a drain connected to the drain of NMOS transistor M8, and a gate connected to the output node OUT.

In addition, output stage 212 has a PNP transistor Q1 and a PNP transistor Q2. PNP transistor Q1 has a base connected to the drains of transistors M7 and M9, an emitter connected to the output node OUT, and a collector connected to ground VSS. PNP transistor Q2, which is substantially the same size as transistor Q1, has a base connected to the drains of transistors M8 and M10, an emitter connected to the inverted output node OUTbar, and a collector connected to ground VSS.

In operation, when a logic low, represented by ground, is present on the input node IN, PMOS transistor M1 is turned on and NMOS transistors M2, M3, and M8 are turned off. When PMOS transistor M1 is turned on, the first supply voltage VDD1 is placed on the gates of NMOS transistors M4 and M7 which, in turn, turns on NMOS transistors M4 and M7.

When NMOS transistor M4 is turned on, the voltage on the output node OUT is pulled down to ground. When NMOS transistor M7 is turned on, the voltage on the base of PNP transistor Q1 is pulled down to ground. When the voltage on the base of PNP transistor Q1 is pulled down to ground, PNP transistor Q1 is turned on and also pulls the voltage on the output node OUT down to ground. Thus, as a result of NMOS transistor M4 and PNP transistor Q1, the logic state on the output node OUT of level shifter 200 matches the logic state on the input node IN.

When the voltage on the output node OUT is pulled down to ground, PMOS transistors M5 and M10 are turned on. When PMOS transistor M5 is turned on, the second supply voltage VDD2 is placed on the gate of PMOS transistor M6 which, in turn, turns off PMOS transistor M6. In addition, the second supply voltage VDD2 is also placed on the inverted output node OUTbar.

Thus, the logic state on the inverted output node OUTbar of level shifter 200 is the inverse of the logic state on the input node IN, and is level shifted up from 1.2V to 3.6V. In addition, when PMOS transistor M10 is turned on, the second supply voltage VDD2 is placed on the base of PNP transistor Q2 which, in turn, turns off PNP transistor Q2.

When the logic state on the input node IN transitions from a logic low to a logic high, PMOS transistor M1 turns off and NMOS transistors M2, M3, and M8 turn on. When NMOS transistor M2 turns on, NMOS transistor M2 pulls down the voltage on the gates of NMOS transistors M4 and M7, thereby turning off transistors M4 and M7.

When NMOS transistor M3 turns on, NMOS transistor M3 immediately saturates and sinks a current IDS3 from the inverted output node OUTbar. When NMOS transistor M8 turns on, NMOS transistor M8 immediately saturates, sinking a current IDS8=$KW_8/L_8(V_{GS}-V_{TH})^2$, where K=μC/2D, $W_8$ is the width of transistor M8, $L_8$ is the length of transistor M8, $V_{GS}$ is the gate-to-source voltage, and $V_{TH}$ is the threshold voltage. When $V_{GS}$=VDD1, NMOS transistor M8 completely turns on. As a result, the maximum achievable drain current of NMOS transistor M8 is IDS8=$KW_8/L_8$ $(VDD1-V_{TH})^2$.

At this point, NMOS transistor M8 sinks all of the current sourced by PMOS transistor M10 and a current from the base of PNP transistor Q2, thereby pulling down the voltage on the base of PNP transistor Q2. As the voltage on the base of PNP transistor Q2 falls, PNP transistor Q2 turns on and sinks a current IEC2 from the inverted output node OUTbar. The current IEC2 can reach a value of $(h21)KW_8/L_8(VDD1-V_{TH})^2$, where h21 is the current gain of transistor Q2. Since the drains of NMOS transistor M8 and PMOS transistor M10 are not connected to the output nodes (the load), NMOS transistor M8 can turn on PNP transistor Q2 relatively quickly.

When the voltage difference between the first and second supply voltages VDD1 and VDD2 is large enough, the falling voltage on the base of PNP transistor Q2 causes PMOS transistor M10 to saturate, outputting a current $ISD10=KW_{10}/L_{10}(V_{SG}-V_{TH})^2$, where $K=\mu C/2D$, $W_{10}$ is the width of transistor M10, $L_{10}$ is the length of transistor M10, $V_{SG}$ is the source-to-gate voltage, and $V_{TH}$ is the threshold voltage.

The sizes of transistors M8 and M10 are defined to guarantee that NMOS transistor M8 sinks all of the current sourced by PMOS transistor M10 after PMOS transistor M10 saturates. To insure that this condition is met, the saturation current IDS8 can be set to be equal to the saturation current ISD10. In addition, to insure against a worst case condition, the gate voltage of PMOS transistor M10 can be assumed to be zero volts. As a result, $ISD10=(KW_{10}/L_{10})(VDD2-V_{TH})^2+IbQ2$, where IbQ2, which is required to overdrive NMOS transistor M8, is the maximum possible base current of transistor Q2.

Setting the saturation current IDS8 to be equal to the saturation current ISD10+IbQ2 provides:

$$KW_8/L_8(VDD1-V_{TH})^2 = KW_{10}/L_{10}(VDD2-V_{TH})^2 + IbQ2,$$

where $IbQ2=(h21^{-1})KW_5/L_5(VDD2-V_{TH})^2$.

Rearranging provides:

$$W_8L_{10}/L_8W_{10} = (1+(W_5L_{10}/L_5W_{10}h21))(VDD2-V_{TH})^2/(VDD1-V_{TH})^2.$$

Thus, by utilizing the above ratios, NMOS transistor M8 is guaranteed to sink all of the current sourced by PMOS transistor M10 and transistor Q2 after transistor M10 saturates.

As noted above, when both NMOS transistor M3 and PNP transistor Q2 are turned on, transistors M3 and Q2 sink currents IDS3 and IEC2 from the inverted output node OUTbar. The currents IDS3 and IEC2, in turn, pull down the voltage on the inverted output node OUTbar. As the voltage on the inverted ouput node OUTbar falls, PMOS transistor M9 turns on when the gate-to-source voltage of transistor M9 falls below the threshold voltage of transistor M9.

When NMOS transistor M7 is turned off and PMOS transistor M9 is turned on, PMOS transistor M9 pulls up the voltage on the base of PNP transistor Q1, thereby turning off PNP transistor Q1. Since the drains of NMOS transistor M7 and PMOS transistor M9 are not connected to the output nodes (the load), PMOS transistor M9 can turn off PNP transistor Q1 relatively quickly.

In addition to PMOS transistor M9, PMOS transistor M6 also turns on as the voltage on the inverted output node OUTbar falls and the gate-to-source voltage of transistor M6 falls below the threshold voltage of transistor M6. Ideally, NMOS transistor M2 pulls down the voltage on the gate of NMOS transistor M4 and turns off transistor M4 before NMOS transistor M3 and PNP transistor Q2 can pull down the voltage on the inverted output node OUTbar to turn on PMOS transistor M6. This minimizes the amount of shoot-through current (the current sourced by PMOS transistor M6 that is sunk by transistor M4).

When NMOS transistor M4 is turned off and PMOS transistor M6 is turned on, PMOS transistor M6 begins charging up the voltage on the output node OUT. Thus, at this point, NMOS transistor M3 and PNP transistor Q2 pull down the voltage on the inverted output node OUTbar while PMOS transistor M6 pulls up the voltage on the output node OUT.

As above, when the voltage difference between the first and second supply voltages VDD1 and VDD2 is large enough, the falling voltage on the inverted output node OUTbar and the rising voltage on the output node OUT cause PMOS transistor M5 to saturate and output a current ISD5.

As the voltage on the output node OUT continues to rise, PMOS transistors M5 and M10 turn off when the gate-to-source voltages of PMOS transistors M5 and M10 reach the threshold voltages of PMOS transistors M5 and M10. When PMOS transistor M5 turns off, NMOS transistor M3 and PNP transistor Q2 pull the remaining voltage on the inverted output node OUTbar down to ground as PMOS transistor M6 charges the voltage on the output node OUT up to the second supply voltage VDD2. Thus, the logic high state on the output node OUT is the same as the logic high state on the input node IN, and is level shifted up from 1.2V to 3.6V. In addition, the logic low state is present on the inverse output node OUTbar.

One of the advantages of the present invention is that when the logic state on the input node IN transitions from a logic low to a logic high, PNP transistor Q2 assists NMOS transistor M3 in pulling down the voltage on the inverted output node OUTbar. As a result, NMOS transistor M3 and PNP transistor Q2 can sink a substantial amount of current from the inverted output node OUTbar, thereby significantly increasing the speed by which the voltage on the output node OUTbar is pulled down.

Another advantage of the present invention is that the size of PMOS transistor M5 can be increased to source a larger amount of current when transistor M5 saturates. Unlike the prior art, where the saturation current of PMOS transistor M5 was limited by the saturation current of NMOS transistor M3, PMOS transistor M5 can be sized to provide a larger saturation current because NMOS transistor M3 and PNP transistor Q2 both pull down the voltage on the inverted output node OUTbar.

As noted above, PMOS transistor M5 and PMOS transistor M6 are substantially the same size. As a result, PMOS transistor M6 can also be formed to be larger which, in turn, substantially reduces the amount of time required to charge up the output node OUT. Thus, the present invention both reduces the amount of time required to pull down the voltage on the inverted output node OUTbar, and the amount of time required to pull up the voltage on the output node OUT.

A similar operation occurs when the logic state on the input node IN transitions from a logic high to a logic low. In this case, PMOS transistor M1 turns on and NMOS transistors M2, M3, and M8 turn off. When PMOS transistor M1 turns on, PMOS transistor M1 pulls up the voltage on the gates of NMOS transistors M4 and M7, thereby turning on transistors M4 and M7.

When NMOS transistor M4 turns on, NMOS transistor M4 immediately saturates and sinks a current IDS4 from the output node OUT. When NMOS transistor M7 turns on, NMOS transistor M7 immediately saturates, sinking a current $IDS7=KW_7/L_7(V_{GS}-V_{TH})^2$, where $K=\mu C/2D$, $W_7$ is the width of transistor M7, $L_7$ is the length of transistor M7, $V_{GS}$ is the gate-to-source voltage, and $V_{TH}$ is the threshold voltage. When $V_{GS}$=VDD1, NMOS transistor M7 completely turns on. As a result, the maximum achievable drain current of NMOS transistor M7 is IDS7=$KW_7/L_7$(VDD1–$V_{TH}$)$^2$.

At this point, NMOS transistor M7 sinks all of the current sourced by PMOS transistor M9 and a current from the base of PNP transistor Q1, thereby pulling down the voltage on the base of PNP transistor Q1. As the voltage on the base of PNP transistor Q1 falls, PNP transistor Q1 turns on and sinks a current IEC1 from the output node OUT. Since the drains of NMOS transistor M7 and PMOS transistor M9 are not connected to the output nodes (the load), NMOS transistor M7 can turn on PNP transistor Q1 relatively quickly.

When the voltage difference between the first and second supply voltages VDD1 and VDD2 is large enough, the falling voltage on the base of PNP transistor Q1 causes PMOS transistor M9 to saturate, outputting a current ISD9=$KW_9/L_9(V_{SG}-V_{TH})^2$, where K=µC/2D, $W_9$ is the width of transistor M9, $L_9$ is the length of transistor M9, $V_{SG}$ is the source-to-gate voltage, and $V_{TH}$ is the threshold voltage.

Like transistors M8 and M10, the sizes of transistors M7 and M9 are defined to guarantee that NMOS transistor M7 sinks all of the current sourced by PMOS transistor M9 after PMOS transistor M9 saturates. To insure that this condition is met, the saturation current IDS7 can be set to be equal to the saturation current ISD9 plus the base current of transistor Q1. In addition, to insure against a worst case condition, the gate voltage of PMOS transistor M9 can be assumed to be zero volts. As a result, ISD9=$(KW_9/L_9)$(VDD2–$V_{TH}$)$^2$.

Setting the saturation current IDS7 to be equal to the saturation current ISD9 plus the base current of transistor Q1 provides $W_7L_9/L_7W_9$=(1+($W_6L_9/L_6W_9$h21))(VDD2–$V_{TH}$)$^2$/(VDD1–$V_{TH}$)$^2$, where the ratio $W_7L_9/L_7W_9$ equals the ratio $W_8L_{10}/L_8W_{10}$. Thus, by utilizing the above ratios, NMOS transistor M7 is guaranteed to sink all of the current sourced by PMOS transistor M9 after transistor M9 saturates.

As noted above, when both NMOS transistor M4 and PNP transistor Q1 are turned on, transistors M4 and Q1 sink currents IDS4 and IEC1 from the output node OUT. The currents IDS4 and IEC1, in turn, pull down the voltage on the output node OUT. As the voltage on the output node OUT falls, PMOS transistor M10 turns on when the gate-to-source voltage of transistor M10 falls below the threshold voltage of transistor M10.

When NMOS transistor M8 is turned off and PMOS transistor M10 is turned on, PMOS transistor M10 pulls up the voltage on the base of PNP transistor Q2, thereby turning off PNP transistor Q2. Since the drains of NMOS transistor M8 and PMOS transistor M10 are not connected to the output nodes (the load), PMOS transistor M10 can turn off PNP transistor Q2 relatively quickly.

In addition to PMOS transistor M10, PMOS transistor M5 also turns on as the voltage on the output node OUT falls and the gate-to-source voltage of transistor M5 falls below the threshold voltage of transistor M5. Since transistor M3 is connected to the input node IN, transistor M3 is turned off before PMOS transistor M5 turns on. As a result, no shoot through current from transistor M5 to transistor M3 exists when the logic state on the input node IN transitions to a logic low.

When NMOS transistor M3 is turned off and PMOS transistor M5 is turned on, PMOS transistor M5 begins charging up the voltage on the inverted output node OUTbar. Thus, at this point, NMOS transistor M4 and PNP transistor Q1 pull down the voltage on the output node OUT while PMOS transistor M5 pulls up the voltage on the inverted output node OUTbar.

When the voltage difference between the first and second supply voltages VDD1 and VDD2 is large enough, the falling voltage on the output node OUT and the rising voltage on the inverted output node OUTbar cause PMOS transistor M6 to saturate and output a current ISD6.

As the voltage on the inverted output node OUTbar continues to rise, PMOS transistors M6 and M9 turn off when the gate-to-source voltages of PMOS transistors M6 and M9 exceed the threshold voltages of PMOS transistors M6 and M9. When PMOS transistor M6 turns off, NMOS transistor M4 and PNP transistor Q1 pull the remaining voltage on the output node OUT down to ground as PMOS transistor M5 charges the voltage on the inverted output node OUTbar up to the second supply voltage VDD2. Thus, the logic low state on the output node OUT is the same as the logic low state on the input node IN. In addition, the logic high state is present on the inverse output node OUTbar, and is level shifted up from 1.2V to 3.6V.

The same advantages of the present invention apply when the logic state on the input node IN transitions low as when the logic state transitions high. In this case, PNP transistor Q1 assists NMOS transistor M4 in pulling down the voltage on the output node OUT. As a result, NMOS transistor M4 and PNP transistor Q1 can sink a substantial amount of current from the output node OUT, thereby significantly increasing the speed by which the voltage on the output node OUT is pulled down.

In addition, as noted above, the size of PMOS transistor M5 can be increased to source a larger amount of current, thereby substantially reducing the amount of time required to charge up the inverted output node OUTbar. Thus, the present invention both reduces the amount of time required to pull up the voltage on the inverted output node OUTbar, and the amount of time required to pull down the voltage on the output node OUT.

Further, the beta of PNP transistor Q1 can be adjusted to sink additional current to enable level shifter 200 to provide high speed operation when the third supply voltage, which is greater than the second supply voltage VDD2, is used in lieu of the second supply voltage VDD2.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A level shifter comprising:
   an inverter having an input node and an intermediate node, the input node having a logic state, the intermediate node having a logic state opposite of the logic state of the input node;
   a first transistor that contacts the inverter and a first output node, the first output node having a logic state;
   a second transistor that contacts the inverter and a second output node, the second output node having a logic state opposite the logic state of the first output node;
   a third transistor that contacts the first transistor and the first output node;
   a fourth transistor that contacts the second transistor and the second output node;
   a fifth transistor that contacts the second transistor;
   a sixth transistor that contacts the fifth transistor; and a seventh transistor that contacts the fifth transistor, the sixth transistor, and the second output node.

2. The level shifter of claim 1 wherein the sixth transistor contacts the first output node.

3. The level shifter of claim 2 wherein the inverter is connected to receive a first supply voltage.

4. The level shifter of claim 3 wherein the first, second, fifth, and seventh transistors are connected to receive ground, and the third, fourth, and sixth transistors are connected to receive a second supply voltage, the second supply voltage being greater than the first supply voltage.

5. The level shifter of claim 2 wherein the fifth and sixth transistors are MOS transistors, and the seventh transistor is a bipolar transistor.

6. The level shifter of claim 2 wherein the third transistor has a gate and a drain, and the fourth transistor has a gate that contacts the drain of the third transistor, and a drain that contacts the gate of the third transistor.

7. The level shifter of claim 1 and further comprising:
an eighth transistor that contacts the first transistor;
a ninth transistor that contacts the eighth transistor; and
a tenth transistor that contacts the eighth transistor, the ninth transistor, and the first output node.

8. The level shifter of claim 7 wherein the ninth transistor contacts the second output node.

9. The level shifter of claim 8 wherein the inverter is connected to receive a first supply voltage.

10. The level shifter of claim 9 wherein the first, second, fifth, seventh, eighth, and tenth transistors are connected to receive ground, and the third, fourth, sixth, and ninth transistors are connected to receive a second supply voltage, the second supply voltage being greater than the first supply voltage.

11. The level shifter of claim 8 wherein the fifth and sixth transistors are MOS transistors, and the seventh transistor is a bipolar transistor.

12. The level shifter of claim 1 wherein the inverter is connected to a first supply voltage, and the third and fourth transistors are connected to a second supply voltage, the second supply voltage being greater than the first supply voltage.

13. A method of level shifting a voltage, the method comprising pulling down an intermediate voltage on a first intermediate node to a first value when an input voltage on an input node has a logic high, the first value turning off a first transistor and a second transistor, the logic high turning on a third transistor and a fourth transistor, the third transistor pulling down an output voltage on an inverting output node, the fourth transistor pulling down an intermediate voltage on a second intermediate node to a second value, the second value turning on a fifth transistor that pulls down the output voltage on the inverting output node.

14. The method of claim 13 and further comprising pulling up the intermediate voltage on the first intermediate node to a third value when an input voltage on the input node has a logic low, the third value turning on the first transistor and the second transistor, the logic low turning off the third transistor and the fourth transistor, the first transistor pulling down an output voltage on a non-inverting output node, the second transistor pulling down an intermediate voltage on a third intermediate node to a fourth value, the fourth value turning on a sixth transistor that pulls down the output voltage on the non-inverting output node.

15. A level shifter comprising:
a level shifting circuit having an input, an inverted output, and a non-inverted output, a logic high at the input having a first voltage, a logic high at the inverted output having a second voltage, a logic high at the non-inverted output having the second voltage, the second voltage being greater than the first voltage; and
a pull down circuit connected to the level shifting circuit that sinks current from the inverted output when the level shifting circuit sinks current from the inverted output, and from the non-inverted output when the level shifting circuit sinks current from the non-inverted output; wherein the pull down circuit includes:
a first transistor connected between the inverted output and ground; and
a second transistor isolated from the inverted output, the second transistor being connected to the first transistor and the level shifting circuit to turn on the first transistor when the level shifting circuit sinks current from the inverted output.

16. The level shifter of claim 15 wherein the level shifting circuit includes a pull down transistor that sinks current from the inverted output when pulling down a voltage on the inverted output to ground, the second transistor being connected to the pull down transistor.

17. A level shifter comprising:
a level shifting circuit having an input, an inverted output, and a non-inverted output, a logic high at the input having a first voltage, a logic high at the inverted output having a second voltage, a logic high at the non-inverted output having the second voltage, the second voltage being greater than the first voltage; and
a pull down circuit connected to the level shifting circuit that sinks current from the inverted output when the level shifting circuit sinks current from the inverted output, and from the non-inverted output when the level shifting circuit sinks current from the non-inverted output, the pull down circuit including:
a first transistor connected between the inverted output and ground; and
a second transistor isolated from the inverted output, the second transistor being connected to the first transistor and the level shifting circuit to turn on the first transistor when the level shifting circuit sinks current from the inverted output;
a third transistor connected between the non-inverted output and ground; and
a fourth transistor isolated from the non-inverted output, the fourth transistor being connected to the third transistor and the level shifting circuit to turn on the third transistor when the level shifting circuit sinks current from the non-inverted output.

18. The level shifter of claim 17 wherein the level shifting circuit includes:
a first pull down transistor that sinks current from the inverted output when pulling down a voltage on the inverted output to ground, the second transistor being connected to the first pull down transistor; and
a second pull down transistor that sinks current from the non-inverted output when pulling down a voltage on the non-inverted output to ground, the fourth transistor being connected to the second pull down transistor.

19. The level shifter of claim 17 and further comprising:
a first PMOS transistor connected to the non-inverted output and the second transistor; and
a second PMOS transistor connected to the inverted output and the fourth transistor.

* * * * *